United States Patent

Rickinger et al.

[11] Patent Number: 5,829,615
[45] Date of Patent: Nov. 3, 1998

[54] EQUIPMENT CASE

[75] Inventors: Thomas Rickinger, Arnstorf; Walter Regirt, Johanniskirchen; Hans Flamme, Unterhaching; Erwin Schaerer, Langenau; Wolfgang Hüttinger, Munich, all of Germany

[73] Assignee: Knürr-Mechanik für die Elektronik Aktiengesellschaft, Munich, Germany

[21] Appl. No.: 656,209
[22] PCT Filed: Dec. 20, 1993
[86] PCT No.: PCT/EP93/03619
  § 371 Date: Dec. 16, 1996
  § 102(e) Date: Dec. 16, 1996
[87] PCT Pub. No.: WO95/17804
  PCT Pub. Date: Jun. 29, 1995
[51] Int. Cl.⁶ .............. B65D 6/28; B65D 6/34; B65D 81/07; B65D 81/107
[52] U.S. Cl. ............ 220/4.01; 206/521; 206/591; 220/62.1; 220/652; 220/653; 220/668
[58] Field of Search ................. 220/4.01, 430, 220/431, 432, 435, 436, 437, 439, 62, 62.1, 604, 668, 683, 684, 692, 693, 651, 652, 680, 415, 416, 419, 445, 448, 4.28, 408; 206/591, 521

[56] References Cited

U.S. PATENT DOCUMENTS 1,582,541 4/1926 Ringer .................. 220/4.01 X
2,226,670 12/1940 Pratt et al. ............ 220/4.01 X
2,483,481 10/1949 Stetson .................... 217/43
2,746,824 5/1956 Bond ..................... 220/448 X
2,932,546 4/1960 Marggraf et al. ........ 206/591 X
3,409,202 11/1968 Belcher ................. 220/4.28 X
4,712,685 12/1987 Kirchhan ................. 206/591
4,771,908 9/1988 McIntosh ................. 220/668
4,998,636 3/1991 Hardigg ................. 220/668 X

*Primary Examiner*—Stephen J. Castellano
*Assistant Examiner*—Niki M. Kopsidas
*Attorney, Agent, or Firm*—Evenson, McKeown, Edwards & Lenahan, PLLC

[57] ABSTRACT

The invention relates to an equipment case with a metallic, self-supporting casing and an inner frame forming a reception space for equipment and components and which is fixed to the casing jacket by means of vibration-damping elements spaced from the casing. According to the invention a casing jacket comprising a single part is provided and its base and cover surfaces and vertical lateral parts are formed in a bending process. Angle bevels and a circumferential, front and back hollow section are formed on the casing jacket. The angle bevels are used for the vibration-damping reception of the inner frame, whilst the hollow section of the casing jacket, in the same way as an extruded section of the front and/or back cover contribute to the integral construction of the equipment case and to a particularly good accessory adaptation.

15 Claims, 5 Drawing Sheets

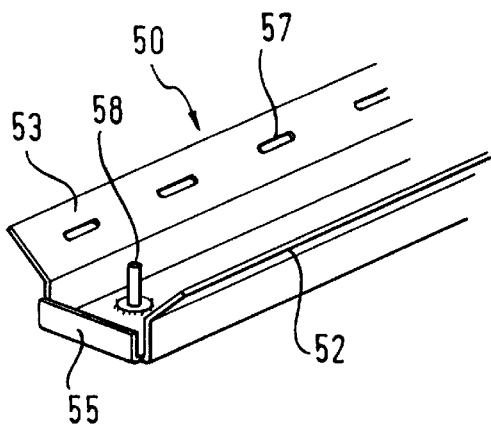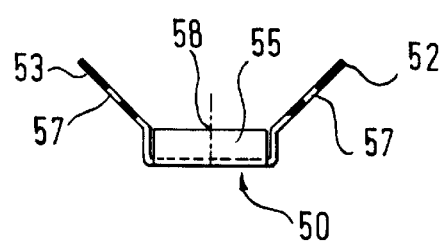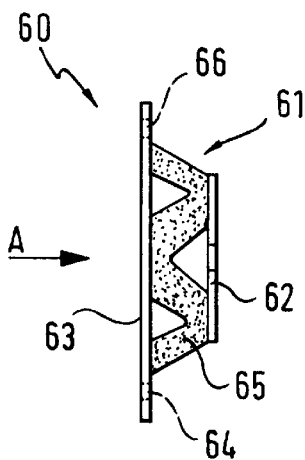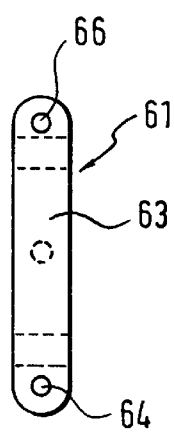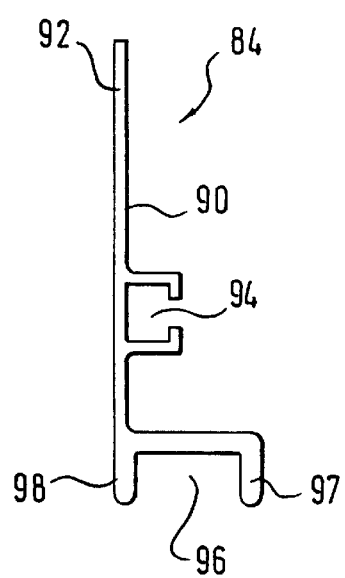

EQUIPMENT CASE

The invention relates to an equipment case with a metallic casing, which has a parallelepipedic casing jacket, as well as a front and a back, at least the front being constructed as a cover or lid. The equipment case is provided with an inner frame, which is fixed by means of vibration-damping elements in spaced manner to the casing jacket and surrounds a reception space for equipment and components.

BACKGROUND OF THE INVENTION

Equipment cases serving as a portable protective casing for electrical and electronic equipment are known and are e.g. described in 0 327 809 A2.

As the equipment is generally used in the military and research fields and must be able to withstand very high mechanical, thermal and other extreme environmental influences, the parallelepipedic or box-like equipment case has a self-supporting, metallic casing with a vibration-resistant casing jacket, a front cover and a back. The back can also be constructed as a cover. Within the casing jacket and spaced therefrom is provided an inner frame with a normally standardized reception space for the equipment and components and which is fixed by means of vibration-damping elements. In the case of the protective casing described in EP 0 327 809 A2 the inner frame is e.g. suspended by means of eight vibration dampers in the angle areas of the casing jacket.

A disadvantage of the hitherto known equipment cases is their relatively complicated and expensive manufacture. For example, the four plate parts of the casing jacket are generally welded together. In order to be able to obtain an electrical shielding (HF-seal), additionally on the cover-side end regions of the casing jacket and on the inner frame, there are flanges or marginal sections for receiving circumferential seals. Manufacture is relatively complicated and costly due to the large number of individual parts, which also means that storage must take place in a particularly easily monitorable manner. In addition, the numerous components and manufacturing steps constitute sources of error, which have a negative effect on the protective function of the equipment case.

SUMMARY OF THE INVENTION

The object of the invention is to provide an equipment case, whose construction ensures high functionality and at the same time permits simple, cost-effective manufacture.

According to the invention the casing jacket, which has a base surface, cover surface and side surfaces, is made from a one-piece, metallic flat material. Between the side or lateral surfaces and the adjacent cover surface, as well as between the side or lateral surfaces and the adjacent base surface is in each case constructed a corner or angle bevel for the vibration-damping reception of an inner frame. On the front and back the casing jacket has a circumferential front or back hollow section, which is formed from the one-piece flat material.

A fundamental idea of the invention is to achieve through an integral construction a functional combination in such a way that the number of individual components and the manufacturing steps are reduced and consequently the manufacture of the equipment case can be made more effective. Apart from the manufacturing and cost advantages a high stability and use value increase of the equipment case is achieved, which is in particular due to an improved design, a protected fitting of closures, handles, etc. and a particularly high accessory adaptation.

According to the invention the casing jacket of the metallic, self-supporting casing, which is generally parallelepipedic or box-like, is made from a single part, so that a reduction of components and manufacturing steps is possible.

The blank part of the casing jacket constructed as one-piece flat material undergoes a bending process. A base surface, a cover surface, two vertical side parts and angle bevels located between said casing jacket areas are formed preferably as 45° bevels.

Advantageously only a single connection or joint, e.g. a weld is required, so as to connect the one-piece casing jacket after the bending process. Another advantage is an unhindered stacking and a troublefree transportation of the equipment case according to the invention, because both in the casing jacket and in the front and back, normally constructed as covers, there are recessed areas for receiving carrying handles, closures, locking devices, etc. These areas and embossings are produced in an inexpensive manner on the single blank part and prior to the bending process.

The 45° angle bevels of the casing jacket contribute to an improved design of the equipment case according to the invention and increase the functionality thereof, because in the angle bevels can be provided fastenings without impairing the actual stacking area of the equipment case.

The casing jacket is provided with a circumferential front and back hollow section, which can also be constructed in a bending process by 45°, 80° and 90° bends. This hollow section assists in a particularly advantageous manner the integral construction of the equipment case according to the invention. Since, due to the weldable recesses in the single blank part, the four angle bevels can also be provided with the casing jacket hollow section, it is possible in a particularly simple manner to have a circumferential seal cooperating with a cover edge. For example, a sealing sleeve can be fitted to a fastening web of the hollow section.

Preferably the front and the homologous back hollow section are provided with a cover side box section increasing the strength. This box section has a roof-shaped sealing edge, on which, when the cover is closed, almost engages a cover-side groove of the cover. On the hollow section is also formed a closing edge for a cover locking means and it is possible to fix a case hinge.

A construction of the casing or case jacket from a single-piece, metallic flat material is an essential inventive concept.

This production procedure is possible to the flat material blank. For this purpose, in the vicinity of the angle bevels, rhombic punchings are provided on either side with respect to a tongue. The depth of the punching in the flat material extends from the marginal edge of the flat material to an inwardly oriented area, which corresponds to the first, outer chamfer of the hollow section. The tongue has an inner narrow area, which is bounded by the rhombic recesses on both sides and which passes out towards the marginal area of the flat material as a thin section line or a thin section channel. Directly on the marginal edge is provided a widening bevel of the section channel. The punchings and section channels consequently are shaped like a "spear tip", and in the symmetry line between two juxtaposed punchings is provided in the flat material the tongue forming the angle bevel.

The angle bevels of the casing jacket not only constitute an advantageous design feature, but also make it possible to have wall fixing and the connection of lined up casings. In addition, crane rings and a stand can be fitted and bottom and roll fastenings can be made in these areas.

The angle bevels are also used for suspending the vibration-resistant inner frame and for this purpose advantageously a reception rail and a vibration mount as the vibration-damping element are placed in the angle bevels. These reception rails and the vibration mounts preferably cooperate with a depth beam, through which the front and back vertical and horizontal beams are joined to the inner frame.

Appropriately the vertical and horizontal beams of the inner frame comprise a unitary frame section with an outer frame web and two T-grooves, which offer variable fastening possibilities. For example, on the inner T-groove open towards the reception space can be fixed telescopic rails, slide-in rails, etc.

The depth beams, which significantly influence the frame strength, can be provided with beads. They represent the assembly plane for sliding in the inner frame and two mounting or fastening flanges arranged at right angles to one another engage with their front and back areas on the associated vertical and horizontal beams. A sloping corner connector connecting the fastening flanges has front and back, projecting covering areas for the end faces of the vertical and horizontal beams.

The reception rail for the vibration mount, which has two lateral faces arranged at right angles to one another and a central rail part, is connected to the casing jacket by adhesive connections or threaded bolts, or also by welding. The reception rail increases the stability of the equipment case, so that the latter is also usable without an inner frame. In this case fastening elements, such as grooves, particularly T-grooves, or elongated holes, which are constructed in the lateral faces are used in particularly advantageous manner for fixing various components, rails, etc.

As a result of the construction of the reception rail an easy fitting of the vibration mount is possible, because the fastening points can be varied. In the central, optionally hollow and cross-sectionally rectangular or U-shaped rail part can be made recesses, as well as fastening bolts, whose number and position can be varied, particularly when using spring nuts.

The vibration mounts are located between a reception frame and depth beam in each case. Appropriately they comprise two flat steel elements, whereof an outer flat steel element is wider than the inner flat steel element and has fastening areas cooperating with the fastening openings or elements of the reception rail. An elastomer material, particularly in M-form is positioned between the two flat steel elements.

The reception space of the equipment case is accessible from the front and optionally also from the rear, which can preferably be HF-sealed with a front or back cover.

In principle, the covers comprise two parts. A cover sheet blank is provided with embossings and depressions for a protected fitting of closures, valves, connections, etc. and has a high strength. A circumferential sealing edge, which can be welded to the cover sheet blank, comprises a connecting web with a T-groove directed towards the reception space and a U-groove directed towards the casing jacket hollow section and which sealingly engages on said hollow section.

BRIEF DESCRIPTION OF THE DRAWINGS

The invention is described in greater detail hereinafter relative to the attached drawings, wherein show:

FIG. 9 A perspective partial view of a first embodiment of a reception rail.

FIG. 10 A front view of a reception rail according to FIG. 9.

FIG. 11 A side view of a vibration mount.

FIG. 12 A view of the vibration mount in accordance with arrow A in FIG. 11.

FIG. 13 A cross-section through a cover sealing edge constructed as an extruded section.

DESCRIPTION OF THE PREFERRED EMBODIMENT

Figure 1:
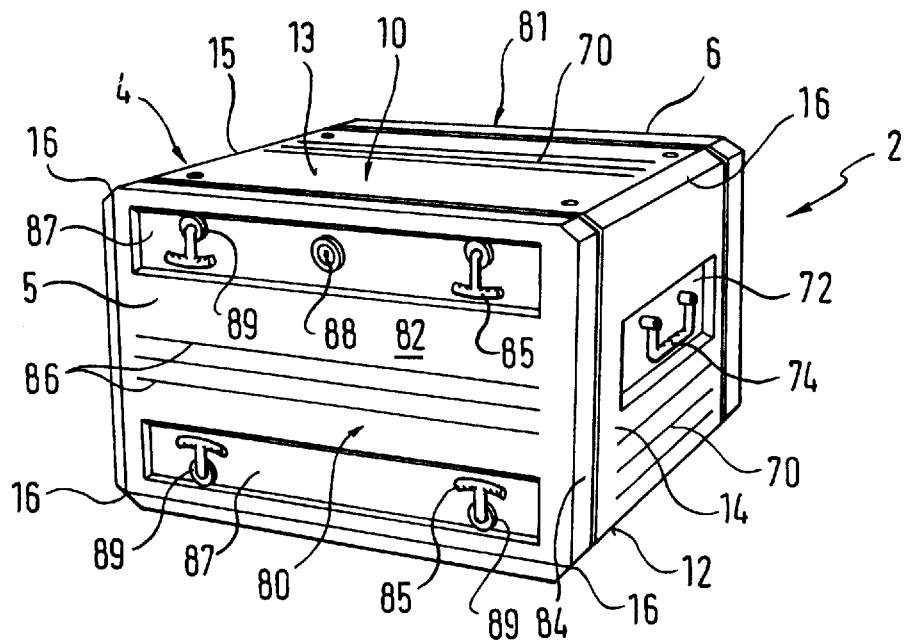
FIG. 1 A perspective view of a preferred embodiment of the equipment case according to the invention.

A preferred embodiment of an inventive equipment case 2 shown in FIG. 1 has a casing 4 with a casing jacket 10 and a front cover 80 and back cover 81 respectively closing the front and back 5, 6.

Figure 2:
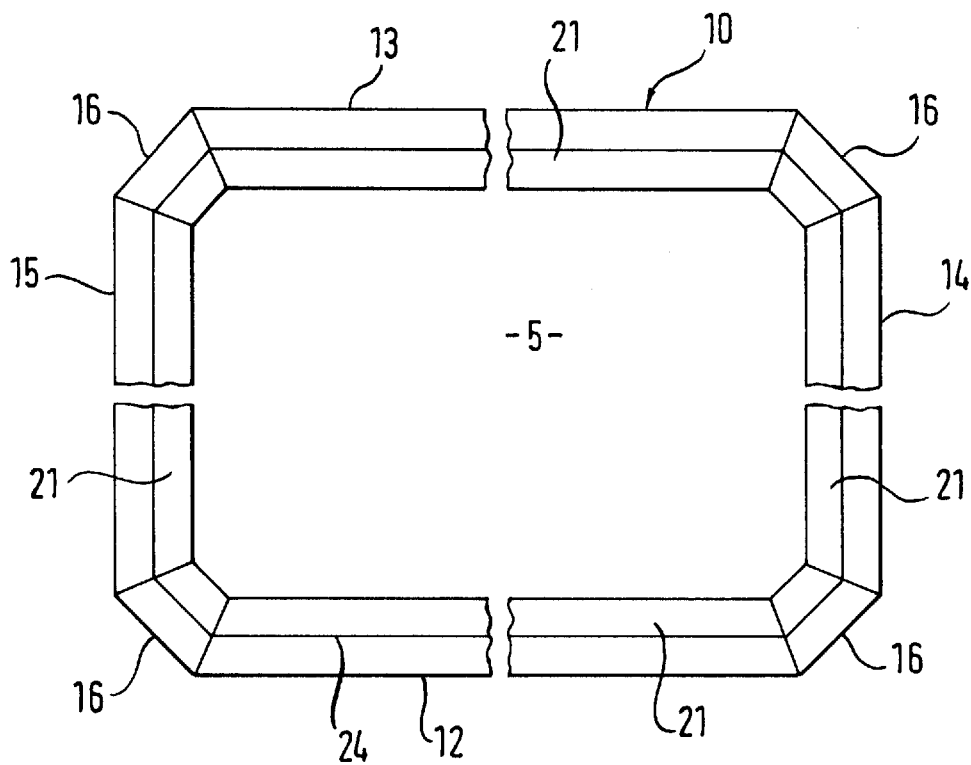
FIG. 2 A diagrammatic plan view of the front of the casing jacket according to FIG. 1.
Figure 3:
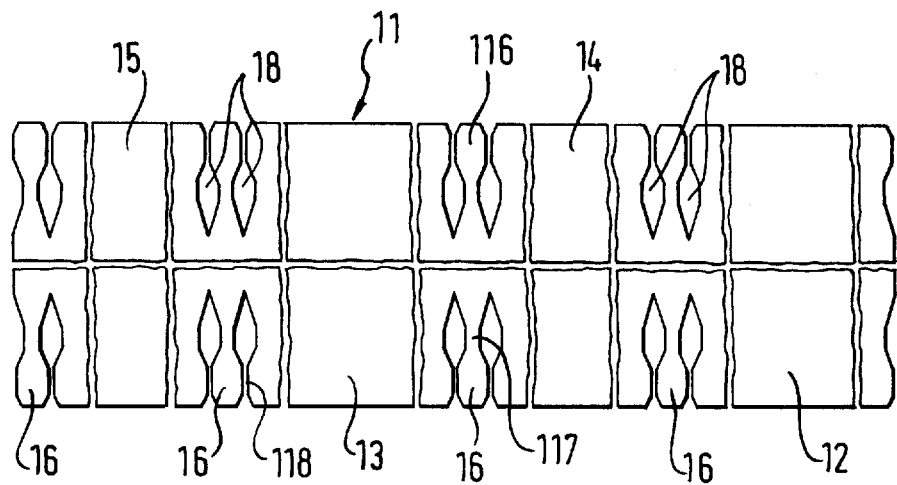
FIG. 3 A casing jacket blank before the bending process.
Figure 4:
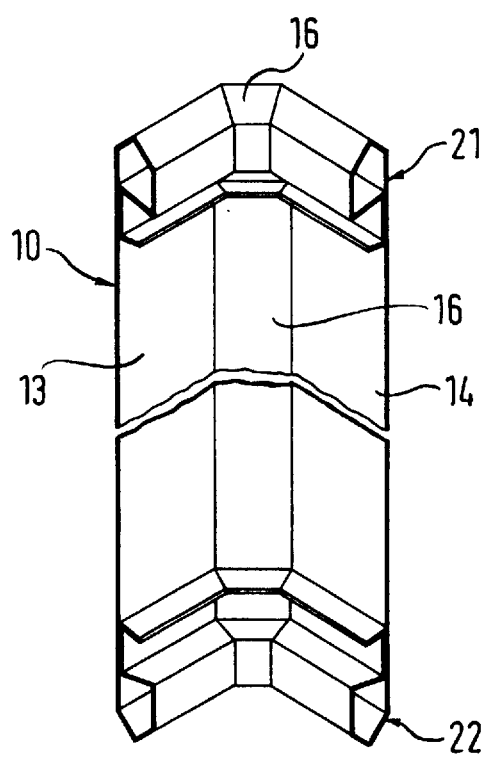
FIG. 4 An inside view of an angle or corner area of a casing jacket according to FIG. 1 with an angle bevel.
Figure 5:
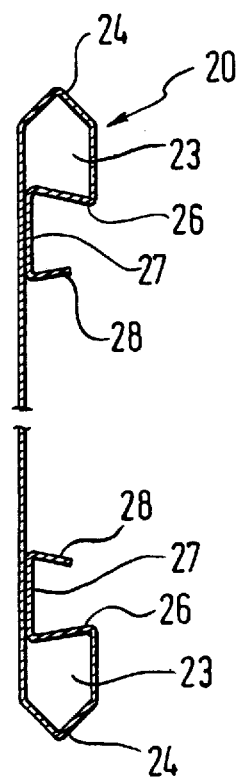
FIG. 5 A vertical section through the cover surface of the casing jacket with a front and back hollow section.

The casing jacket 10 is produced in a bending process from a single blank part 11 according to FIG. 3, which is a one-piece, metallic flat material. Vertical lateral surfaces or parts 14, 15, a cover surface 13 and a base surface 12, as well as the 45° angle bevel 16, together with a front and back hollow section 21, 22 (FIGS. 2 and 4) are constructed. The hollow section 20 can be produced by welding in the four angle bevels 16 of the inventive casing jacket 10 (FIG. 2) as a result of the rhombic recesses 18 formed in the single blank part 11 (FIG. 3). The hollow section 20 of the casing jacket 10 comprises a front hollow section 21 and a homologously constructed back hollow section 22. By 45°, 80° and 90° bends of the single part 11 of the casing jacket 10 are formed a box section 23 (FIG. 5) with a roof-like sealing edge 24 directed towards the front and back covers 80, 81, and with a closing edge 26, together with a support web 27 engaging on the casing jacket 10 and a terminal fastening web 28, e.g. for a sealing sleeve.

The flat material blank 11 for the case jacket 2 has in the area of the angle bevel 16 a tongue 116. This tongue 116 provided at the top and bottom in the flat material has a narrower web 117 towards the centre of the flat material and which is bounded on both sides by the rhombic punchings 18.

The punching 18 extends from the marginal edge of the flat material 11 as a narrow section line 118 into the rhombic area directed towards the centre.

In the case of an equipment case 2 closed with a cover 80, behind the closing edge 26 engages a L-shaped, rotary lever operable with a handle 85.

FIG. 1 also shows the embossings 70 made before the bending process and the recessed areas 72, e.g. for handles 74, which are not shown in the single part 11 of the metallic flat material blank according to FIG. 3, and which together with the angle bevels contribute to a particularly esthetic overall impression of the equipment case 2.

The equipment case 2 according to FIG. 1 can be closed with an identically constructed front and back cover 80, 81, a cover comprising a cover sheet blank 82 and a sealing edge 84. The sealing edge 84 is preferably welded to the cover sheet blank 82 and comprises an extruded section, which will be described in conjunction with FIG. 13. The cover sheet blank 82 has high strength and stiffening embossings 86, as well as depressions 87 for locking means 89 with pivotable handles 85 and for connections e.g. a valve 88.

Figure 6:
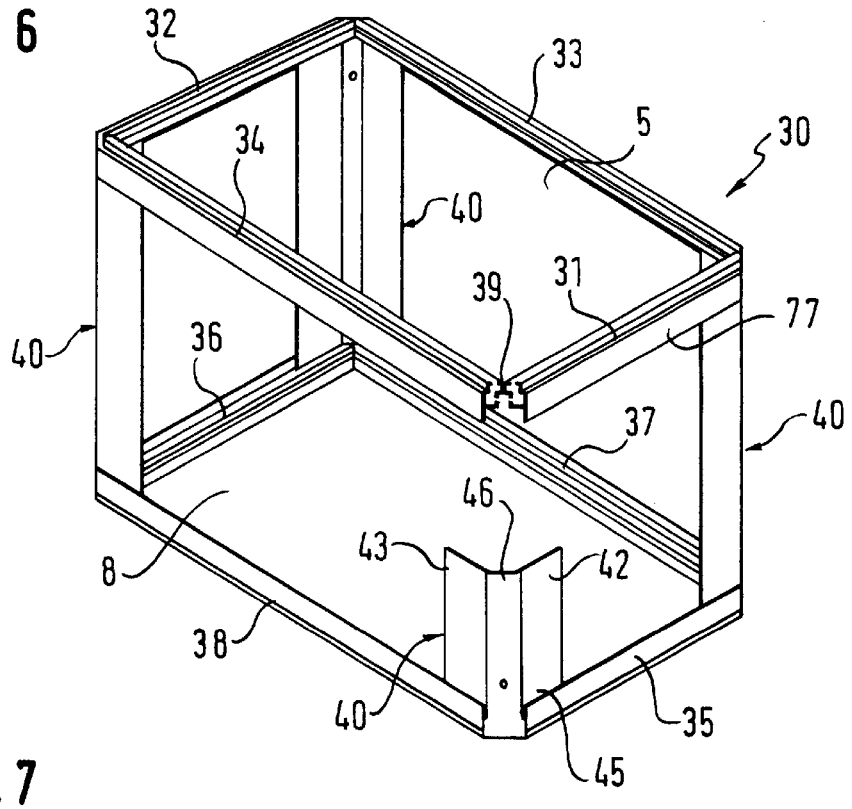
FIG. 6 A perspective view of an inner frame.

FIG. 6 shows an inner frame 30 with the front 5 directed upwards and which comprises front vertical and horizontal beams 31, 32; 33, 34 and back vertical and horizontal beams 35, 36; 37, 38, as well as four depth beams 40 interconnecting the vertical and horizontal beams. The inner frame surrounds a standardized reception space 8, in which can be received the equipment and components.

Figure 7:
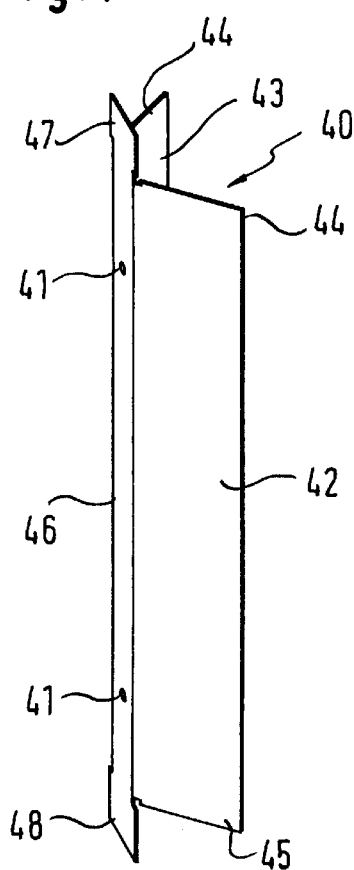
FIG. 7 A perspective view of a depth beam of the inner frame.

A depth beam 40, which determines the stability of the inner frame 30, is shown in a perspective view in FIG. 7. The depth beam 40 with a front and back area 44, 45 on two lateral fastening flanges 42, 43 can be slid into the associated front and back vertical and horizontal beams, e.g. into the vertical beams 31, 35 and horizontal beams 34, 38, the end faces 39 of the vertical and horizontal beams being covered by projecting covering areas 47, 48 of a corner connector 46 arranged in sloping manner between the fastening flanges 42, 43. The corner connector 46 has fastening openings 41, which are used for retaining the depth beams 40 or the inner frame 30 on a vibration mount 61 as a vibration-damping element 60 or on a reception rail 50.

Figure 8:
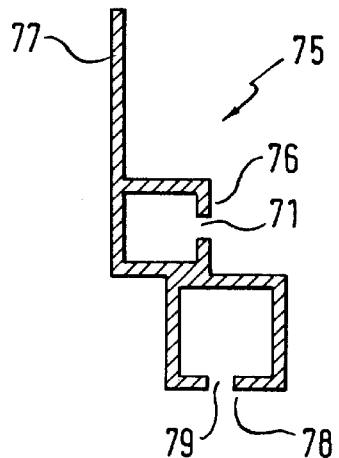
FIG. 8 A cross-section through the frame profile of the inner frame.

In a particularly cost-effective manner the vertical and horizontal beams 31 to 38 of the inner frame 30 are made from a unitary section 75 shown in cross-section in FIG. 8. On a frame web 77 directed towards the casing jacket 10 is formed an inner T-groove 76 with a slot 71 directed towards the reception space 8, e.g. for receiving telescopic rails and the like. Following a bending of the frame web 77 a further, outer T-groove 78 is present, whose slot 79 is directed towards the front or back 5, 6.

FIG. 9 shows a first variant of a reception rail 50 for a vibration mount 61 serving as a vibration-damping element 60 and which is to be welded or bonded into each angle bevel 16 of the casing jacket 10. The reception rail 50 runs with a rail part 55 between the front hollow section 21 and the rear hollow section 22 of the casing jacket 20. The rail part 55 is arranged identically to the inventive angle bevel 16 of the casing jacket 10 as a 45° bevel between two lateral surfaces 52, 53 at right angles to one another. The rail part 55 is cross-sectionally rectangular and hollow and in this embodiment is provided with centrally positioned fastening elements 58, e.g. press-in bolts. In the lateral surfaces 52, 53 are provided elongated holes 57 which, particularly using spring nuts, can serve to fix various built-in parts, such as cross-connections, if the equipment case is used without the inner frame 30.

FIG. 10 shows a diagrammatic cross-section through the reception rail 50, identical features being given the same reference numerals.

The vibration mount (FIGS. 11 and 12) comprises two flat steel elements 62, 63 interconnected by a M-shape elastomer material 65. The outer flat steel element 63 engages on rail part 55 of reception rail 50 and is e.g. held on its fastening bolts 58 by means of fastening openings 64, 66. The inner flat steel element 62 then engages on the depth beam 40 of the inner frame 30.

FIG. 13 diagrammatically shows a sealing edge 84 of a front or back cover 80, 81. An extruded section 90 with a connecting web 92 e.g. weldable to the cover sheet blank 82 is provided with a T-groove 94 and a U-groove 96. The T-groove 94 is used for fixing additional elements and components. The U-groove 96 engages with its vertical legs 97, 98 on the hollow section 20 of the casing jacket 10 and ensures an effective sealing of the equipment and components in the equipment case.

Figure 14:
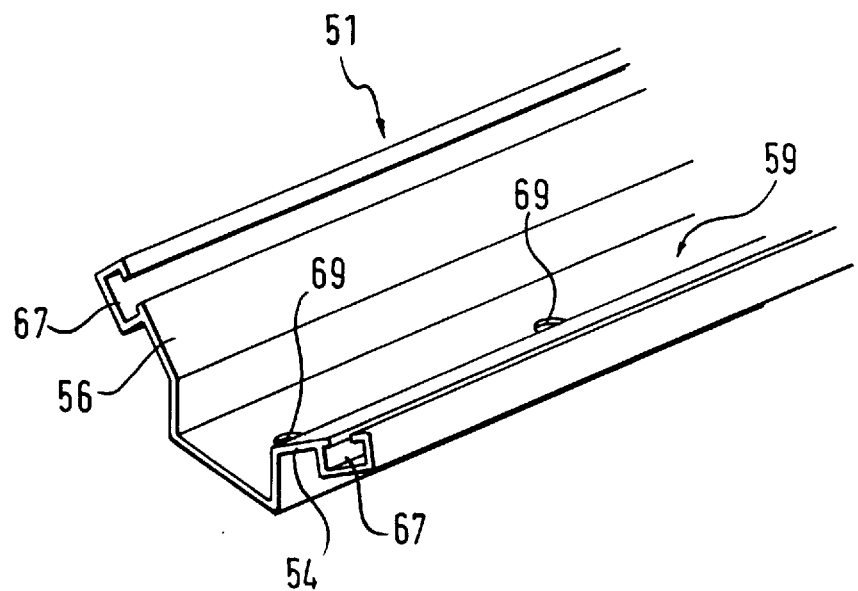
FIG. 14 A perspective partial view of a further embodiment of a reception rail.
Figure 15:
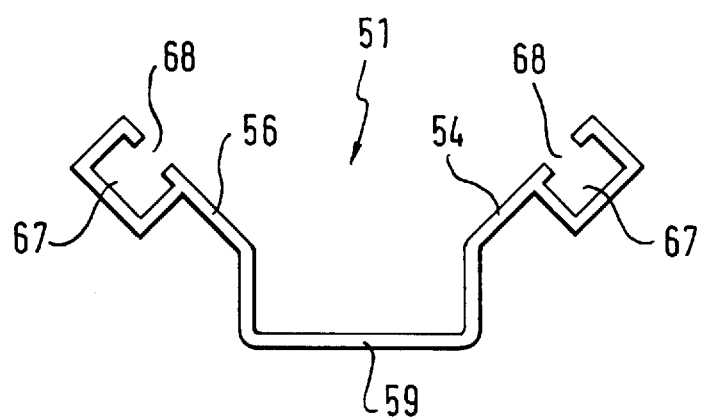
FIG. 15 A front view of a reception rail according to FIG. 14.

FIG. 14 shows another preferred embodiment of a reception rail 51 which is similar to the reception rail 50. Two lateral surfaces 54, 56 at right angles to one another are connected by a central rail part 59 to be fixed in the angle bevel 16 of the equipment case 2. The central rail part 59 is cross-sectionally U-shaped and provided with fastening openings 69. For the variable fastening of different built-in parts, particularly if the equipment case is used without an inner frame, each lateral surface 54, 56 is provided with a longitudinally directed T-groove 67. The T-grooves 67 are constructed homologously with directed towards one another slots 68 on the reception rail 51 (FIG. 15).

We claim:

1. An equipment case with a metallic casing, which has a parallelepipedic casing jacket, comprising:

a base surface, a cover surface, lateral surfaces, a front, and a back, at least the front being contructed as a cover, an inner frame surrounding a reception space for equipment and components, and vibration damping elements which fix the inner frame to the casing jacket in a spaced manner, wherein the casing jacket is made from a one-piece, metallic flat material by bending process, forming the base surface, the cover surface, the lateral surfaces, angle bevels between the lateral surfaces and the adjacent cover surface or base surface as well as a circumferential front and back hollow section for the front and back of the casing jacket, wherein the angle bevels are provided for fixing of the vibration damping elements and the front and back hollow section is formed by multiple bending of cut-to-size flat material and in each case a box section with a roof-like sealing edge directed towards the front and back and a diametrically arranged cover edge for cover locking, and wherein the box section is bent inwards to a support web engaging on the casing jacket and a terminal fastening web projecting almost at right angles to the support web, particularly for a sealing element.

2. An equipment case-according to claim 1, characterized in that each angle bevel is constructed as a narrow 45° bend of the lateral surfaces, cover surface and base surface of the casing jacket, that the front and back hollow section of the casing jacket is formed in the angle bevels by weldable recesses in the flat material and that for fixing the inner frame between the front and back hollow section of the angle bevels, in each case there is a reception rail for a vibration-damping element and for the inner frame.

3. An equipment case according to claim 2, characterized in that the lateral surfaces, cover surface and base surface of the casing jacket to be bent have prefabricated embossings and recessed areas for arranging handles, connecting and transporting elements, as well as closure areas.

4. An equipment case according to claim 2, characterized in that the reception rails fixable in the angle bevels of the casing jacket have two lateral surfaces arranged at right angles to one another and a central rail part constructed in complimentary manner to the angle bevels and which are provided with fixing areas.

5. An equipment case according to claim 4, characterized in that the reception rails are held in the angle bevels of the casing jacket by adhesive connection.

6. An equipment case according to claim 4, characterized in that the fixing areas of the lateral surfaces of a reception rail are elongated holes and that the central rail part is a rectangular hollow section, whose fastening areas are fastening bolts.

7. An equipment case according to claim 4, characterized in that the fastening areas of the lateral surfaces of a reception rail are constructed as a T-groove and that the central rail part has a U-shaped hollow section, whose fastening areas are bores.

8. An equipment case according to claim 2, characterized in that the vibration-damping element is constituted by a vibration mount, which comprises an inner and an outer flat steel element, which are arranged parallel to one another and are interconnected by means of an elastic device, particularly an elastomer piece.

9. An equipment case according to claim 8, characterized in that the elastomer piece is M-shaped and that the outer flat steel element can be fixed to the central rail part of the reception rail by means of fastening areas, whilst the inner flat steel element can be fixed to the inner frame by means of fastening openings of the depth beams.

10. An equipment case according to claim 1, characterized in that the inner frame is formed from front and back positioned vertical beams and horizontal beams, which have a unitary frame section and are interconnected by depth beams.

11. An equipment case according to claim 10, characterized in that the frame section of the vertical and horizontal beams has a frame web directed towards the casing jacket and having an inner and an outer T-groove, the slot of the inner T-groove being directed towards the reception space and the slot of the outer T-groove towards the front or back.

12. An equipment case according to claim 10, characterized in that each depth beam has two fastening flanges arranged at right angles to one another and whose front and back areas can be fixed to the associated vertical and horizontal beams and that the fastening flanges are interconnected by means of a corner connector, which is located in a 45° bevel and has a projecting front and back cover area for the end faces of the vertical and horizontal beams of the inner frame.

13. An equipment case according to claim 1, characterized in that a cover terminating the front or optionally the back of the casing jacket has a cover sheet blank and a circumferential sealing edge.

14. An equipment case according to claim 13, characterized in that the cover sheet blank is provided with embossings and depressions for protected locking means, valves and connections and that as the sealing edge an extruded section is fixed, particularly welded to the cover sheet blank.

15. An equipment case according to claim 14, characterized in that the extruded section of the cover has a connecting web fixable to the cover sheet blank with a radially inwardly directed T-groove and a terminal, reinforced U-groove, whose legs, when the cover is closed, sealingly engage on the roof-shaped sealing edge of the hollow section of the casing jacket.

\* \* \* \* \*